United States Patent
Nemouchi et al.

(10) Patent No.: US 9,093,552 B2
(45) Date of Patent: Jul. 28, 2015

(54) MANUFACTURING METHOD FOR A DEVICE WITH TRANSISTORS STRAINED BY SILICIDATION OF SOURCE AND DRAIN ZONES

(75) Inventors: Fabrice Nemouchi, Moirans (FR); Patrice Gergaud, La Buisse (FR); Thierry Poiroux, Voiron (FR); Bernard Previtali, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 13/591,485

(22) Filed: Aug. 22, 2012

(65) Prior Publication Data

US 2013/0214363 A1  Aug. 22, 2013

(30) Foreign Application Priority Data

Aug. 25, 2011 (FR) .................................. 11 57532

(51) Int. Cl.
| | |
|---|---|
| *H01L 21/8238* | (2006.01) |
| *H01L 21/84* | (2006.01) |
| *H01L 21/285* | (2006.01) |
| *H01L 29/78* | (2006.01) |
| *H01L 27/12* | (2006.01) |
| *H01L 29/10* | (2006.01) |
| *H01L 27/092* | (2006.01) |
| *H01L 21/768* | (2006.01) |

(52) U.S. Cl.
CPC ...... *H01L 21/8238* (2013.01); *H01L 21/28518* (2013.01); *H01L 21/7682* (2013.01); *H01L 21/76816* (2013.01); *H01L 21/76855* (2013.01); *H01L 21/823807* (2013.01); *H01L 21/823814* (2013.01); *H01L 21/823878* (2013.01); *H01L 21/84* (2013.01); *H01L 27/092* (2013.01); *H01L 27/1203* (2013.01); *H01L 29/1054* (2013.01); *H01L 29/7845* (2013.01); *H01L 29/7848* (2013.01); *H01L 21/76814* (2013.01)

(58) Field of Classification Search
CPC .......................... H01L 27/092; H01L 21/8238
USPC ........................................... 257/369; 438/229
See application file for complete search history.

(56) References Cited

U.S. PATENT DOCUMENTS

| | | | |
|---|---|---|---|
| 5,989,965 | A | 11/1999 | Maa et al. |
| 6,339,245 | B1 | 1/2002 | Maa et al. |
| 2003/0045039 | A1 | 3/2003 | Shin et al. |
| 2006/0220113 | A1 | 10/2006 | Tamura et al. |
| 2007/0066001 | A1 | 3/2007 | Iinuma et al. |

(Continued)

FOREIGN PATENT DOCUMENTS

JP  11-67694 A  3/1999

OTHER PUBLICATIONS

U.S. Appl. No. 13/591,407, filed Aug. 22, 2012, Nemouchi et al.

(Continued)

*Primary Examiner* — Matthew Landau
*Assistant Examiner* — Igwe U Anya
(74) *Attorney, Agent, or Firm* — Oblon, McClelland, Maier & Neustadt, L.L.P.

(57) ABSTRACT

A method for making a microelectronic device with transistors, in which silicided source and drain zones are formed to apply a compressive strain on the channel, in some transistors.

12 Claims, 10 Drawing Sheets

(56) References Cited

U.S. PATENT DOCUMENTS

| | | | |
|---|---|---|---|
| 2007/0099360 A1 | 5/2007 | Lee et al. | |
| 2007/0269970 A1* | 11/2007 | Purtell et al. | 438/581 |
| 2007/0287240 A1 | 12/2007 | Chen et al. | |
| 2008/0191243 A1* | 8/2008 | Liu et al. | 257/190 |
| 2009/0050972 A1 | 2/2009 | Lindsay et al. | |
| 2009/0085125 A1 | 4/2009 | Kim et al. | |
| 2009/0104746 A1 | 4/2009 | Clifton et al. | |
| 2009/0134381 A1* | 5/2009 | Shimamune et al. | 257/19 |
| 2009/0227079 A1* | 9/2009 | Iinuma | 438/233 |
| 2011/0049640 A1* | 3/2011 | Feustel et al. | 257/369 |
| 2011/0065245 A1 | 3/2011 | Chen et al. | |
| 2011/0084320 A1 | 4/2011 | Jung | |
| 2011/0159654 A1 | 6/2011 | Kronholz et al. | |
| 2011/0201165 A1* | 8/2011 | Hoentschel et al. | 438/229 |
| 2011/0266625 A1* | 11/2011 | Carter et al. | 257/365 |
| 2012/0187460 A1* | 7/2012 | Lavoie et al. | 257/288 |
| 2013/0052805 A1 | 2/2013 | Previtali | |

OTHER PUBLICATIONS

French Preliminary Search Report Issued Mar. 22, 2012 in Patent Application No. 1157532 9with English translation of Categories of Cited Documents).

"Applying Mechanical Stress to Improve MOS Semiconductor Performance", IBM Technical Disclosure Bulletin, XP000104874, vol. 30, No. 9, Feb. 1988, pp. 330-333.

An Steegen et al., "Silicide-induced stress in Si: origin and consequences from MOS technologies", Materials Science and Engineering, vol. 38, 2002, pp. 1-53.

G. Lucadamo et al., "Stress evolution in polycrystalline thin film reactions", Thin Solid Films, vol. 389, 2001, pp. 8-11.

O.B. Loopstra et al., "Model for stress and volume changes of a thin film on a substrate upon annealing: Application to amorphous Mo/Si multilayers", Physical Review B, vol. 44, No. 24, Dec. 15, 1991, pp. 519-533.

F.M. d'Heurle et al., "Stresses during Silicide Formation: A Review", Defect and Diffusion Forum, vols. 129-130, 1996, pp. 137-150 with cover page.

Oliver Thomas et al., "Stress Development During the Reactive Formation of Silicide Films", Defect and Diffusion Forum, vols. 237-240, 2005, pp. 801-812 with cover page.

P. Gergaud et al., "Influence of Si substrate orientation on stress development in Pd silicide films frown by solid-state reaction", Applied Physics Letters, vol. 83, No. 7, Aug. 18, 2003, pp. 1334-1336 with cover page.

P. Gergaud et al., "Stresses arising from a solid state reaction between palladium films and Si(001) investigated by in situ combined x-ray diffraction and curvature measurements", Journal of Applied Physics, vol. 94, No. 3, Aug. 1, 2003, pp. 1584-1591 with cover page.

S.-L. Zhang et al., "Stresses from solid state reactions: a simple model, silicides", Thin Solid Film, vol. 213, 1992, pp. 34-39 with cover page.

* cited by examiner

MANUFACTURING METHOD FOR A DEVICE WITH TRANSISTORS STRAINED BY SILICIDATION OF SOURCE AND DRAIN ZONES

TECHNICAL FIELD

The present application concerns the field of microelectronic transistor devices and in particular strained channel transistors comprising silicided source and drain zones.

The invention includes a method for making a strained transistor device wherein the channels of some transistors are strained particularly by silicided source and drain zones.

Its applications are mainly in the manufacturing of transistors smaller than 22 nm.

STATE OF PRIOR ART

Current performances of field effect transistors are related particularly to mobility of charge carriers, in other words electrons for N type transistors and holes for P type transistors.

In a transistor channel, the displacement velocity of charge carriers may be improved by applying strain on the transistor. Applying a strain can distort the crystalline network of the semiconducting material and modify its band structure, and particularly the charge transport properties.

A compressively strained channel transistor facilitates the displacement of holes in the channel, while a tensile strained channel facilitates the displacement of electrons.

Therefore, if one want to obtain a gain in the performance of PMOS transistors, one will usually want to compressively strain them, while a gain in the performance of NMOS transistors is obtained by applying a tensile strain on their channels.

There are different methods available for inducing a strained state in a transistor channel.

It is known how to apply a strain on the transistor channels by depositing a stressing layer selected to apply a given type of strain, for example a tensile strain, on the source and drain zones and on the gate of the transistors.

However, if a device comprising different types of transistors is made, for example PMOS type transistors and NMOS type transistors, the external layer applies the strain indifferently on all the transistors, which can be harmful to operation of some transistors, for example PMOS transistors when this external layer is designed to apply a tensile strain.

Documents US 2007/0099360 A1 and US 2007/0287240 A1 disclose methods of making strained channel transistors using a silicon nitride layer 11 deposited on the source zone 2 and drain zone 4 and on the gate 6 of the transistor (FIGS. 1A and 1B).

The strain layer based on silicon nitride 11 may be kept on the gate 6 (FIG. 1A) or removed from above the gate 6 so as to only come in contact with the spacers 14 formed on the sides of the gate (FIG. 1B).

The first step towards forming a device with transistors tensile strained and compressively strained transistors is to form a first layer of silicon nitride 9 that will apply tensile strain on all transistors.

This first layer of silicon nitride 9 is covered with an etching stop layer 10 and is then removed by etching above the transistors to be compressively strained. A second layer of silicon nitride 11 is then deposited that will apply compressive strain. This second layer 11 is then removed from all transistors to be tensile strained, by etching and stopping on the stop layer 10 (FIG. 1A).

It is also known that strained channel transistors can be formed by a subjacent layer.

Document US 2009/0085125A1 discloses a device provided with a transistor, the channel 21 of which is strained by epitaxied growth of a layer of material 21 with lattice parameters different from Si (FIG. 1C). Such a material 21 may for example be based on SiGe on which a gate dielectric 20 is formed by growth of an Si layer followed by thermal oxidation of Si. In this case, a channel 21 strained in compression can be obtained to make a PMOS transistor.

The device comprises another transistor for which the channel 31 is strained by expitaxial growth of another layer of material 31. For example, such a material 31 may be based on SiC on which a gate dielectric 30 is formed by growth of an Si layer followed by thermal oxidation of this Si layer. In this case, a tensile strained channel 31 can be obtained to make an nMOS transistor (FIG. 1C).

Such a method requires many photolithography steps and etching steps, and epitaxy depositions to implement such a device.

Document US 2009/0050972 A1 contains an example embodiment of a strained channel transistor.

Document US 2009/0050972 A1 describes another example embodiment of a strained channel transistor.

The problem arises of making a device with at least one compressively strained transistor.

PRESENTATION OF THE INVENTION

The invention relates to a method for making a microelectronic transistor device comprising the following steps:

a) formation of a barrier layer based on a given material on first semiconducting zones located on each side of a first gate block of a first transistor, said given material being different from the material used in said first semiconducting zones, b) form openings passing through the barrier layer, one or several given openings exposing the first semiconducting zones, c) deposit a metallic material through said openings, followed by annealing, so as to form metal and semiconductor alloy zones, the volume of metallic material deposited on the first semiconducting zones and the annealing duration being chosen so as to form first metal and semiconductor alloy zones applying a compressive strain on a channel zone of said first transistor.

The metal and semiconductor alloy zones made in step c) are confined by said barrier layer.

The barrier layer may be designed to prevent metal diffusion during step c).

Such a barrier layer makes it possible to maintain the strain applied by the first metal and semiconductor alloy zones, compared with a method in which metal-semiconductor alloy zones are formed without a barrier layer.

Thus, the barrier layer may be chosen based on a material that is not likely to react with the material deposited in step c).

The barrier layer may preferably be based on a material that is not a semiconductor, to avoid a reaction with the metallic material.

The barrier layer may preferably be based on a material that is neither metallic nor formed from a metal and semiconductor alloy, to prevent short circuits.

The barrier layer can thus be based on a dielectric material.

The barrier layer may be based on a material capable of applying a strain on the first transistor.

According to one possible embodiment, the barrier layer may be based on $Si_xN_y$ that is a dielectric material capable of applying strain on the first transistor.

Thus, according to the invention, metal and semiconductor alloy zones are formed within semiconducting source and drain zones of a transistor by metal deposition and annealing (silicidation process). These zones apply a compressive strain, particularly on the channel zone of the first transistor.

The size of the openings is preferably chosen to be sufficiently small so that the strain induced by silicidation can be maintained. Openings can thus have a diameter of between 10 and 50 nanometers, particularly when the critical dimension or width of the first transistor gate is less than 20 nanometers.

In step a), the barrier layer may also be formed on second semiconducting zones located on each side of a second gate block of a second transistor, a sacrificial layer being provided between said given material layer and said second semiconducting zones of the second transistor, while in step b), among the openings passing through the barrier layer, one or several given openings expose second semiconducting zones. The method may then also include removal of the sacrificial layer between step b) and step c) by etching through said openings thus leaving cavities, in step c), said metallic deposition and said annealing being done so as to form second metal and semiconductor alloy zones partially filling in said cavities, a space being maintained between said second metal and semiconductor alloy zones and said barrier layer.

Thus, according to one aspect of the invention, metal and semiconductor alloy zones are formed in second source and drain semiconducting zones of a second transistor, by depositing metal and annealing. Etching of a sacrificial layer provided on part of said second semiconducting zones forms cavities that are partially filled in during formation of metal and semiconductor alloy zones, such that these metal and semiconductor alloy zones do not apply any compressive strain on the second transistor, or that this strain is limited.

Differently strained transistors can thus be made on the same support.

According to one possible embodiment, the first gate block and the second gate block are supported on a semiconducting layer, the first semiconducting zones and/or the second semiconducting zones being formed by growth on said semiconducting layer.

Said semiconducting layer in zones located on each side of said first gate block and/or said second gate block can be thinned prior to said growth.

As a result, after growth, the first semiconducting zones can be obtained in contact with a zone in the semiconducting layer that will form a transistor channel of the first type and/or second semiconducting zones can be obtained in contact with a zone in the semiconducting layer that will form a transistor channel of the second type.

According to one possible embodiment of the method, the first semiconducting zones may be formed from a semiconducting material designed to strain said semiconducting layer on which said first gate block is supported, in compression. The first semiconducting zones may for example be formed based on SiGe, particularly when the semiconducting layer is based on Si.

If this semiconducting layer has previously been thinned, a compressive strain may be applied onto the channel zone on which the first gate block is supported.

According to one possible embodiment of the method, the second semiconducting zones may be formed from a semiconducting material designed to apply a tensile strain on said semiconducting layer on which said second gate block is supported. The second semiconducting zones may for example be based on SiC, particularly when the semiconducting layer is based on Si.

If this semiconducting layer has been thinned in advance, a tensile strain may be applied onto the channel zone on which the second gate block is supported.

Before step a), insulating spacers may be formed in contact with said first gate block and said second gate block. In this case, said strain layer may be supported on said spacers.

According to one possible embodiment, said barrier layer is formed in step a) so as to cover the first gate block and so as to strain the transistor of the first type.

According to one possible embodiment, the first gate block and/or said second gate block are based on at least one sacrificial material.

The method may then also comprise the following steps after step c):
create an opening in the barrier layer on said first gate block and/or said second gate block, so as to expose said sacrificial material,
remove said sacrificial gate material,
replace said sacrificial material by at least another gate material.

This invention also relates to a device obtained using such a method.

This invention also relates to a microelectronic transistor device comprising first semiconducting zones located on each side of a first gate block of a first transistor and covered by a barrier layer based on a given material on said given material different from that of said first semiconducting zones, openings passing through the barrier layer, one or several given openings exposing the first semiconducting zones, first metal and semiconductor alloy zones being formed through the openings and arranged so as to apply a compressive strain on a channel zone on said first transistor.

According to one possible embodiment of the microelectronic device, said barrier layer may also cover second semiconducting zones on each side of a second gate block of a second transistor, a sacrificial layer being provided between said given material layer and said second semiconducting zones of the transistor of the second type, one or several given openings formed in the barrier layer exposing the second semiconducting zones, a space being provided between said second metal and semiconductor alloy zones and said barrier layer.

Thus, the first transistor and the second transistor are strained differently from each other.

The barrier layer may be a strain layer.

The second semiconducting zones may be formed from a semiconducting material such as SiC designed to apply a tensile strain on a semiconducting layer on which said second gate block is supported.

BRIEF DESCRIPTION OF THE DRAWINGS

This invention will be better understood after reading the description of example embodiments given for information and that are in no way limitative, with reference to the appended drawings in which.

Figure 1A:
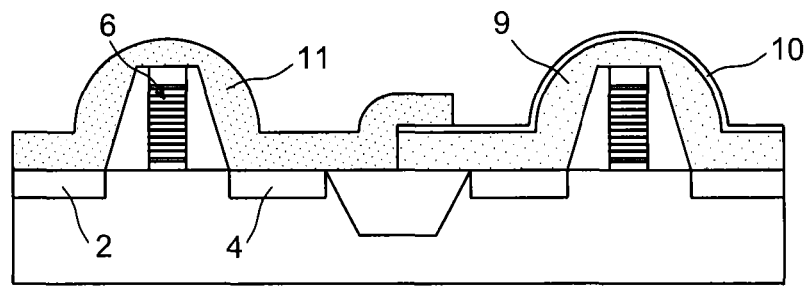
FIGS. 1A-1C give examples of microelectronic transistor devices according to prior art provided with PMOS and NMOS transistors, compressively strained in and tensile strained respectively.
Figure 1B:
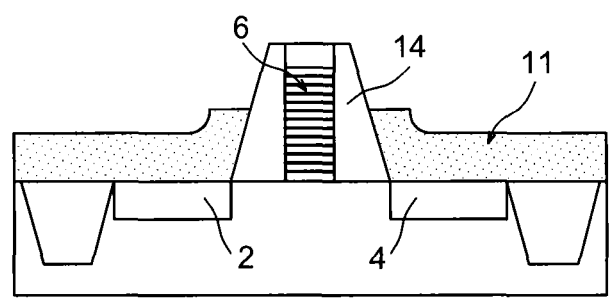
Figure 1C:
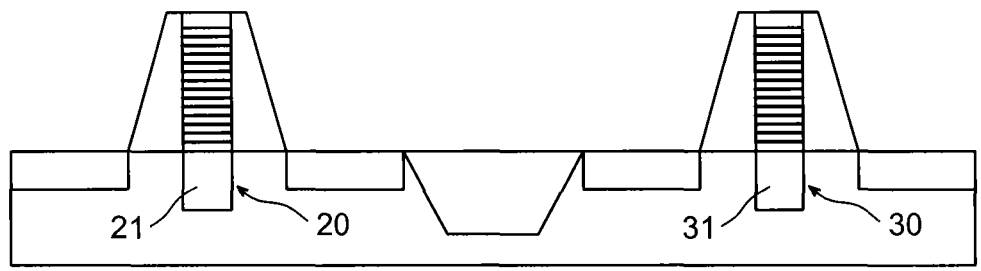

The different parts shown in the figures are not necessarily all at the same scale, to make the figures more easily understandable.

DETAILED PRESENTATION OF PARTICULAR EMBODIMENTS

An example method according to the invention for making a microelectronic device with strained channel transistors will be described with reference to FIGS. 2A-2K.

The initial material may be a substrate 100, for example of the SOI (Silicon On Insulator) type formed from a semiconducting support layer 101, an insulating layer 102 covering the support layer 101 and a thin semiconducting layer 103 on the insulating layer 102. The insulating layer 102 of the substrate 100 may for example be an ultra thin silicon buried oxide of the UTBox (Ultra Thin Buried oxide) type, for example with a thickness of between 5 nm and 145 nm.

A first gate 108a of a transistor T1 of a first type, for example of the PMOS type supported on a first region 103a of the thin semiconducting layer 103 and a second gate 108b of a transistor $T_2$ of a second type, for example of the NMOS type supported on a second region 103b of the thin semiconducting layer 103, are formed on the support 100. Doping elements may have been previously added in the thin semiconducting layer 103.

Figure 2A:
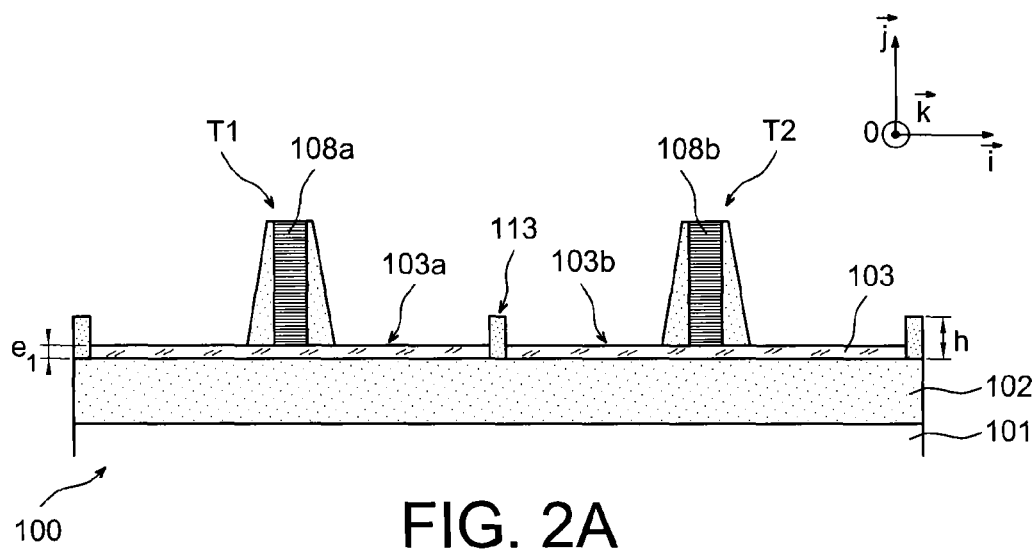
FIGS. 2A-2K show an example of a method according to the invention for microelectronic transistor devices in which the channel is strained.
Figure 2B:
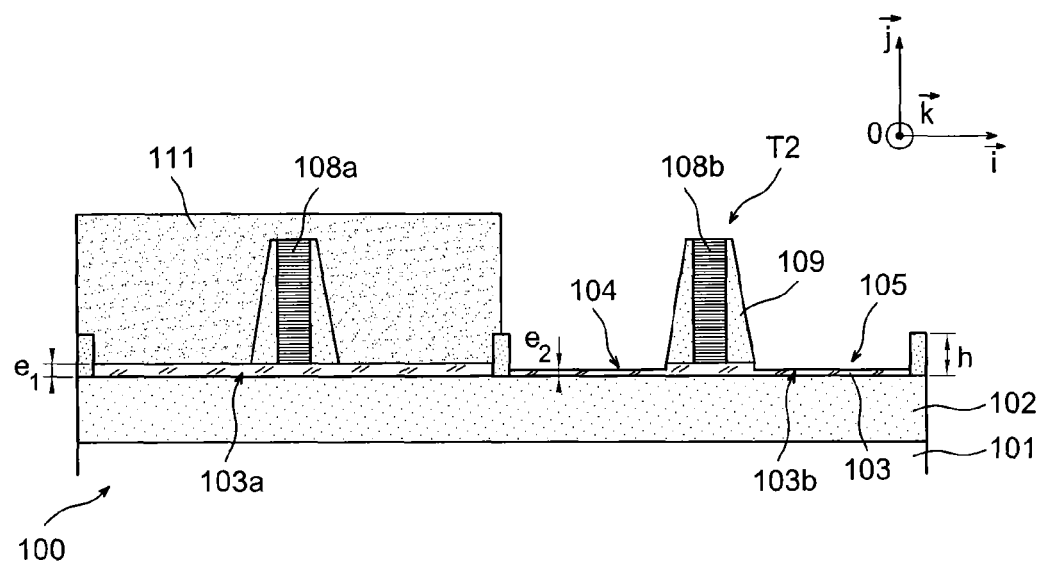

STI (Shallow Trench Isolation) type isolation zones 113 may also be provided between the transistors T1, T2, in order to electrically isolate these transistors from each other (FIG. 2A).

These STI isolation zones 113 may be designed so as to project beyond the thickness of the thin semiconducting layer 103. The thin semiconducting layer 103 may have a thickness e1 (measured in FIG. 2B along a direction parallel to the vector $\vec{j}$ in the orthogonal coordinate system [O, $\vec{i}$; $\vec{j}$; $\vec{k}$]) for example between 5 nm and 50 nm and preferably between 5 nm and 10 nm, while the STI isolation zones 113 may have a height h (also measured in FIG. 2B along a direction parallel to the vector $\vec{j}$) for example between 10 nm and 100 nm.

The STI isolation zones 113 may be designed to project beyond the thickness of the thin semiconducting layer 103 with a predetermined thickness E=h-e1, selected particularly as a function of the thickness of semiconducting zones that will be made later and will form the source and drain regions of the transistors T1 and T2.

The next step is to remove portions of the second region 103b from each side of the second gate 108b, so as to thin the second semiconducting region 103b of the semiconducting layer 103 in zones 104, 105, that will form a source and drain of the second transistor T2. After thinning, the sides of a channel zone located under the gate 108b are exposed.

This can be done through steps to deposit a masking layer, for example a hard mask layer based on silicon nitride, followed by photolithography and etching steps, to form a hard mask 111 covering the first gate 108a and the first semiconducting region 103a. The second gate 108b and the second semiconducting region 103b are exposed.

The zones 104, 105 in the second semiconducting region 103b may be thinned so as to keep a thickness of the semiconducting material for example between 3 nm and 10 nm. While thinning the second semiconducting region 103b, the channel zone located under the second gate 108b may be protected by a gate dielectric zone, and by isolating spacers 109 adjacent to the second gate 108b. A thickness $e_1$ greater than the thickness $e_2$ of zones 104, 105 in the semiconducting region 103b that will belong to a source zone and a drain zone respectively of the second transistor $T_2$ (FIG. 2B), can be kept for the channel zone.

According to one variant embodiment (not shown), the height h of the isolation zones 113 is dependent on the thickness $e_1$ of the thin semiconducting layer 103 such that h-$e_1$ is sufficient to enable growth of semiconducting zones on the second region 103b particularly without passing beyond the summit of the isolation zones 113. The second region 103b is not necessarily thinned in this variant.

Figure 2C:
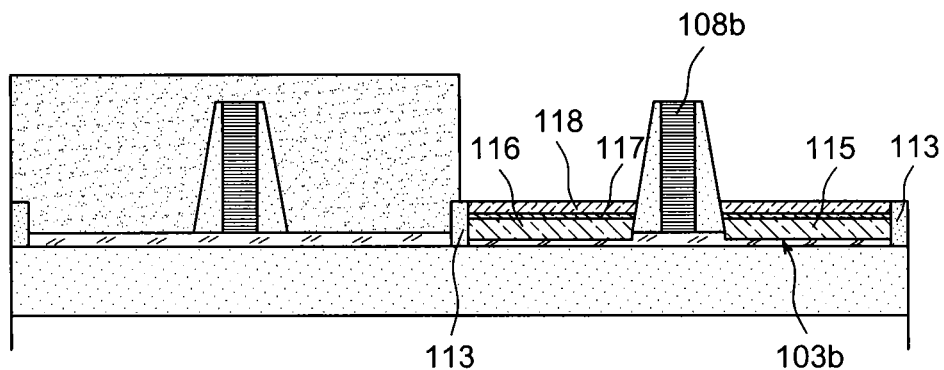

Semiconducting zones 115, 116 are then formed on the second semiconducting region 103b, on each side of the gate (FIG. 2C).

These semiconducting zones 115, 116 may be made by epitaxial growth.

The lattice parameter of the semiconducting material of zones 115, 116 may be chosen to be less than the lattice parameter of the semiconducting material of the second semiconducting region 103b. In this case, the created semiconducting zones 115, 116 apply a strain on the semiconducting zone 103b, and particularly a tension strain on the channel zone of the transistor $T_2$.

When the semiconducting material of the semiconducting layer 103 is made of silicon, the material of the semiconducting zones 115, 116 may for example be SiC for example with a thickness of between 5 nm and 30 nm.

An etching stop layer 117 is deposited on the semiconducting zones 115, 116. For example, this stop layer 117 may be formed based on SiGe, for example with a thickness of the order of 1 nm.

The next step is to form a sacrificial layer 118. The material used for the sacrificial layer 118 may be chosen so that it can be selectively etched relative to the material of a so-called "strain layer" that will be made later.

The sacrificial layer 118 may also be formed with a predetermined thickness as a function of a silicidation step that will be done later. The sacrificial layer 118 may for example be formed based on Si, for example with a thickness of between 5 nm and 10 nm (FIG. 2C).

According to one possible embodiment, the cumulated thickness of each semiconducting zone 115, 116, of the etching stop layer 117 and the sacrificial layer 118 may be selected such that the summit of the isolation zones 113 and an exposed face of the sacrificial layer 117 have the same or approximately the same height.

The hard mask 111 can then be removed.

The steps to deposit a masking layer, for example a hard mask layer based on silicon nitride and then photolithography and etching, can be selected to form another hard mask 121 covering the second gate 108b and the semiconducting zones 115, 116. The first gate 108a and the first semiconducting region 103a are exposed.

A step to thin the zones 106, 107 of the first semiconducting region 103a located on each side of the gate 108a of the first transistor T1 may also be performed.

Figure 2D:
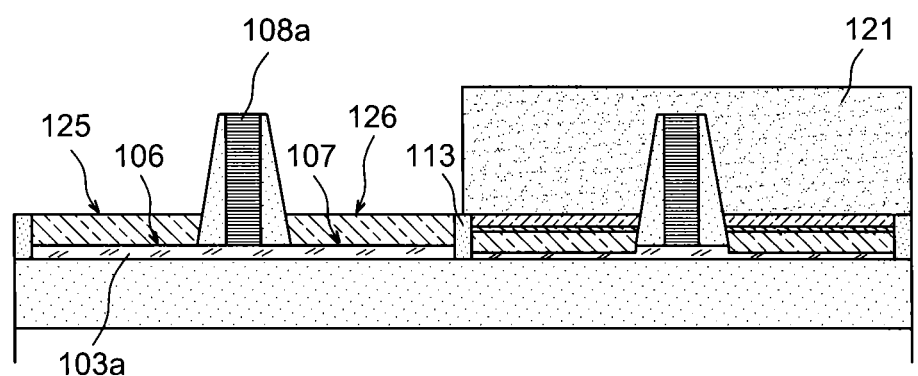

The next step is to form semiconducting zones 125, 126 on the first semiconducting region 103a. These semiconducting zones 125, 126 may be done by epitaxy, for example with a thickness of between 5 nm and 30 nm (FIG. 2D).

The material used for zones 125, 126 may be a semiconductor with a lattice parameter chosen to be greater than the lattice parameter of the semiconducting material of the first semiconducting region 103a.

In this case, the semiconducting zones 125, 126 apply compressive strain on the semiconducting region 103a, and particularly on the channel zone of the transistor $T_1$.

When the semiconducting material in the semiconducting layer 103 is silicon, the material in the semiconducting zones 125, 126 may for example be SiGe with a thickness for example of between 5 nm and 30 nm.

The next step is to remove said other hard mask 121.

A "barrier" layer 130 is then formed.

In this case, this barrier layer 130 may be based on a given material different from the material in the first semiconducting zones. The barrier layer 130 is chosen such that during production of metal and semiconductor alloy zones, particularly a silicidation that will be done later on the first semiconducting zones, it does not react with metal deposited during this silicidation and it prevents diffusion of metal and expansion of metal and semiconductor alloy zones. This makes it possible to maintain or even increase the strain, due to a silicide confinement effect.

To achieve this, the barrier layer 130 may be based on a material that is inert to the metal that will be deposited during a subsequent silicidation step. Thus, the given material is preferably not semiconducting.

To avoid short circuit phenomena, the given material of the barrier layer 130 is preferably not metallic or metal-based.

The barrier layer 130 may be based on a dielectric material, for example such as $Si_3N_4$.

The barrier layer 130 may also be based on a given material that can apply a strain on the channel of some transistors in the device. The layer 130 may be selected particularly to apply a strain on the transistor channel of a given type, for example on the first PMOS type transistor $T_1$. In this case, the barrier layer 130 may for example be based on a silicon nitride such as $Si_3N_4$.

This barrier layer 130 may also be selected to act as an etching stop layer for at least one etching step that will be done later. To achieve this, the barrier layer 130 may for example be based on a silicon nitride material such as $Si_3N_4$.

The barrier layer 130 may be deposited in a conforming manner on all transistors $T_1$ et $T_2$ and cover the gates 108a, 108b and the semiconducting zones 125, 126, 115, 116 formed on each side of the gates 108a, 108b.

Figure 2E:
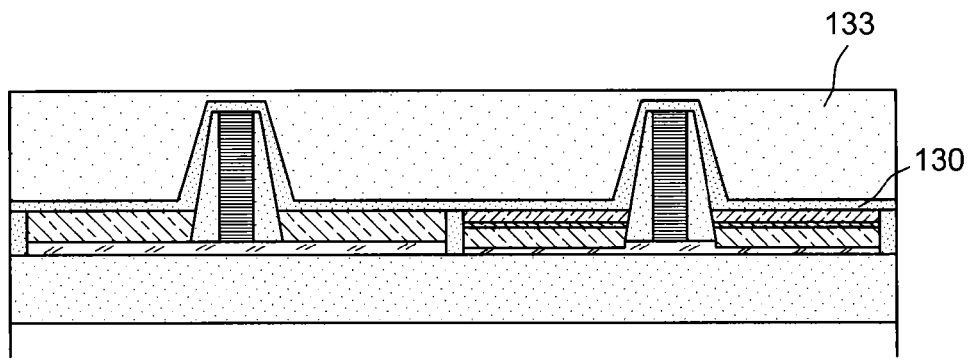

A layer of dielectric material 133 is then formed so as to cover the gates 108a, 108b. This layer of dielectric material 133 can then be planed, for example using a chemical-mechanical polishing (CMP) method. The dielectric material 133 may be chosen so that it can be etched selectively relative to the material of the barrier layer 130. For example, the dielectric material 133 may be $SiO_2$ when the barrier layer 130 is based on a silicon nitride $Si_xN_y$, such as $Si_3N_4$ (FIG. 2E).

The next step is to make the openings 141, 143, 145, 147, passing through the layers 130 and 133, and which will hold the source and drain contact pads of the first transistor $T_1$ and the second transistor $T_2$. This can be done by selective etching of the layer of dielectric material 133 stopping on the barrier layer 130. The openings 141, 143 that will hold the source and drain contact pads of the first transistor $T_1$ may have a diameter D (defined in FIG. 2F as being the smallest dimension in a plane parallel to the [O; $\vec{i}$; $\vec{j}$] plane in the [O; $\vec{i}$, $\vec{j}$; $\vec{k}$]) orthogonal coordinate system), for example between 10 and 50 nanometers, particularly when the gate of the first transistor has a critical dimension or width less than 20 nanometers.

The openings 141, 143, 145, 147, are then prolonged by etching the barrier layer 130, stopping on the sacrificial layer 117 (variant shown in FIG. 2F), or possibly on the etching stop layer 118 (variant not shown). This etching of the barrier layer 130 may be done for example using $H_3PO_4$ when the barrier layer is based on $Si_xN_y$.

The sacrificial layer 117 is also removed. The sacrificial layer 117 may be removed for example by etching using a TMAH solution.

This removal leads to the formation of cavities 151, 152 between the barrier layer 130 and the semiconducting zones 115, 116 of the second transistor $T_2$. The volume of these cavities 151, 152, that in particular depends on the thickness of the sacrificial layer, may be selected as a function of a silicidation step that will be done later.

Figure 2F:
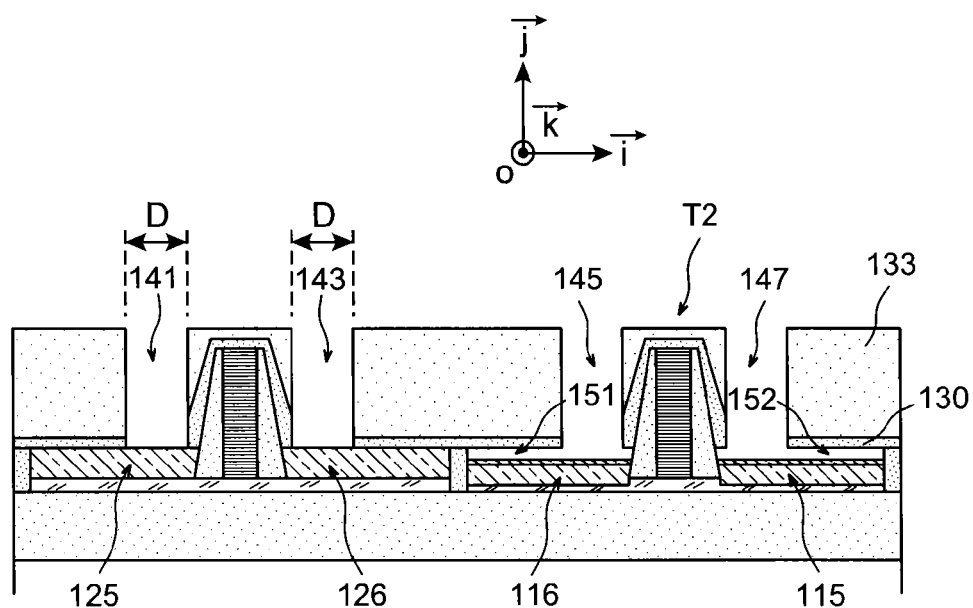

If the material in the barrier layer 130 is also selected so as to strain the first transistor $T_1$, removal of the sacrificial layer 118 can relieve the strain that was applied by this barrier layer 130 on the second NMOS type transistor $T_2$ (FIG. 2F).

For example, the sacrificial layer 118 may be based on Si while the stop layer may be based on $Si_xGe_y$. In this case, this sacrificial layer 118 can be etched using a TMAH based solution, for example a solution containing 25% of TMAH in order to obtain a selectivity of the order of 30 between the silicon and the $Si_{0.7}Ge_{0.3}$ of the stop layer 117. Thus, with such selectivity, removal of a sacrificial layer 118 of Si with a thickness for example of the order of 30 nm will lead to a consumption of $Si_{0.7}Ge_{0.3}$ in the stop layer 117 of not more than 1 nm.

Figure 2G:
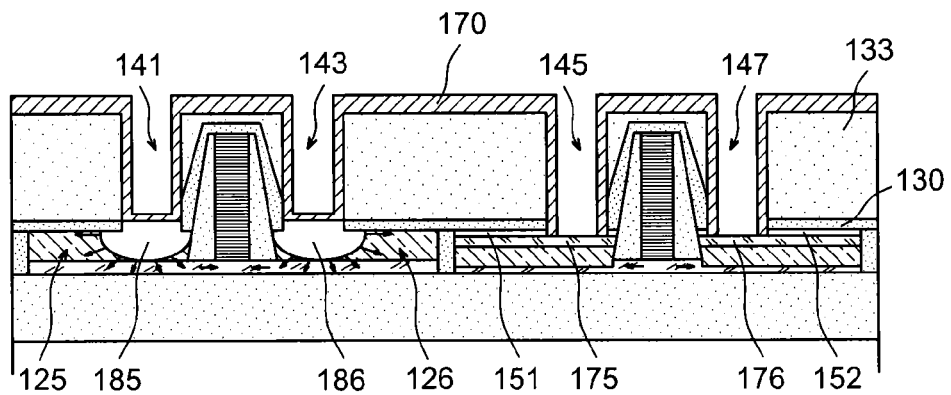

The semiconducting zones 115 and 116 exposed by openings 145, 147, formed on each side of gate 108b of the second transistor $T_2$ and semiconducting zones 125 and 126 exposed by openings 141, 143, formed on each side of gate 108a of the first transistor T1, can then be silicided (FIG. 2G).

This silicidation can be made by depositing a metallic material 170 reacting with the semiconducting material firstly in semiconducting zones 115, 116 and secondly in semiconducting zones 125 and 126.

The metallic material 170 may be composed of a metal or an alloy of metals chosen among from one or several transition metals or the following rare earths, for example nickel, palladium, platinum, titanium, Cobalt, Erbium, Ytterbium or an alloy of them. The deposit may be non-conforming, such that the maximum thickness of deposited material is at the surface on zones parallel to the main plane of the substrate 100 (defined as in FIG. 2B along a direction parallel to vector $\vec{j}$ of the orthogonal coordinate system [O; $\vec{i}$; $\vec{j}$; $\vec{k}$]) and at the bottom of the openings 141, 143, 145, 147, while the thickness of the deposited material is minimal on the walls of the openings 141, 143, 145, 147. For example, the deposit may be of the PVD (Physical Vapour Deposition) type, in which a metal thickness may for example be between 1 nm and 10 nm, for example of the order of 5 nm.

The metallic material 170 for the second transistor $T_2$ may be deposited in the openings 145, 147 so as to only partially fill in the cavities 151, 152.

One or several silicidation annealing(s) may then be done using a Rapid Thermal (RT) process at a temperature for example between 150° C. and 800° C. and for example preferably between 190° C. and 400° C. leading to the reaction between silicon and the metal forming a silicide (FIG. 2G).

During silicidation, the silicide zones 175, 176, 185, 186 are formed by reactive diffusion between the metal and the semiconductor and contribute to a local increase in the volume.

This leads to the appearance of compression strains at the metal/semiconductor alloy zones 185, 186 at the bottom of the openings 141, 143, made on each side of the gate 108a of the first transistor $T_1$. The metal/semiconductor alloy zones 185, 186 can apply a strain at the zones that will act as sources and drains for the first transistor $T_1$ and spacers, this strain being applied at the channel of the first transistor $T_1$. The presence of a barrier layer 130 on the semiconducting zones 125, 126 confines the silicide, and it can prevent metal diffusion and expansion of silicided zones in a space located beyond the face of this barrier layer 130 that is not in contact with the first semiconducting zones 125, 126. The barrier layer 130 can thus maintain or even increase the strain formed by the silicidation, by a silicide confinement effect. The size of the openings 141, 143 on each side of the first transistor $T_1$ is preferably chosen to be sufficiently small so that the strain induced by silicidation can be retained. The openings 141, 143 may thus have a diameter D1 between 10 and 50 nanometers, particularly when the gate of the first transistor has a critical dimension or width of less than 20 nanometers.

During this silicidation, silicided zones 175, 176 are also formed at the semiconducting zones that will act as sources and drains of the second nMOS type transistor T2.

Despite an increase in the volume of the silicided zones 175, 176, the cavities 151, 152 previously formed by etching the sacrificial layer 117 are provided such that after silicidation, a remaining space is kept between the silicided zones 175, 176 and the strain layer 130. Cavities 151, 152 are thus preferably not entirely filled.

The result is that compressive strains on the channel zone of the second NMOS type transistor $T_2$ are limited or even prevented (FIG. 2G), by allowing relaxation of silicided zones.

A strain of more than –2 GPa may be applied on the first transistor $T_1$.

For example, in the case in which a $Pd_2Si$ based silicide is formed, the variation of volume between the silicide and the silicon may be of the order of 209%, which can induce a triaxial strain of –50 GPa.

For given volumes of semiconducting material and deposited metallic material, a maximum strain may be reached when all the metallic material 170 deposited has been consumed.

A strain relaxation may be planned and modulated as a function of the time planned for annealing.

Therefore, it is possible to control the strain level in the silicided zones 185, 186 by adjusting the annealing time and/or the annealing temperature. This strain level also depends on the type of metallic material 170 and the corresponding volumes of semiconducting material in the zones 125, 126 and the deposited metallic material 170.

The following table gives volume variations during a silicidation reaction in the solid state with normalised volumes per unit of metal.

| Metal | Silicon | Silicide | Silicide/(metal + silicon) | Silicide/less mobile species |
|---|---|---|---|---|
| Ti | 2Si | TiSi$_2$ | 0.77 | TiSi$_2$/Ti |
| 1.00 | 2.24 | 2.50 | | 2.50 |
| 2 Pd | Si | Pd$_2$Si | 0.84 | Pd$_2$Si/Si |
| 1.00 | 0.68 | 1.42 | | 2.09 |
| Pt | Si | PtSi | 0.84 | PtSi/Si |
| 1.00 | 1.35 | 1.98 | | 1.49 |
| 2 Co | Si | Co$_2$Si | 0.77 | Co$_2$Si/Si |
| 1.00 | 0.91 | 1.47 | | 1.47 |
| Ni | Si | NiSi | 0.77 | NiSi/Si |
| 1.00 | 1.83 | 2.18 | | 1.20 |
| Ni | Si | NiSi$_2$ | 0.76 | NiSi$_2$/Si |
| 1.00 | 3.66 | 3.59 | | 0.99 |
| Ta | 2Si | TaSi$_2$ | 0.75 | TaSi$_2$/Ta |
| 1.00 | 2.21 | 2.40 | | |
| Mo | 2Si | MoSi$_2$ | 0.73 | MoSi$_2$/Mo |
| 1.00 | 2.57 | 2.60 | | |
| W | 2Si | WSi$_2$ | 0.73 | WSi$_2$/W |
| 1.00 | 2.52 | 2.58 | | |

The choice of the deposited metallic material 170 and the silicide that is to be formed may also be chosen for example depending on the planned application for the transistor device, and/or depending on the technological node, in other words the planned size for transistors in the device.

For example, for technological nodes C0=45 nm and C0=32 nm, it may be decided to make silicided zones of PtSi and NiSi for their low electrical resistivity.

The choice of the metallic material 170 and the silicide formed may also depend on difficulties in implementing the production method, for example associated heat treatment, cleaning, etching steps to be applied.

The metallic material 170 may also be chosen based on a mechanical criterion, in other words depending on the intensity of the strain to be applied on the zones 185, 186.

For example, this can be done by choosing a silicide with high elastic properties in terms of Young's modulus, the resulting strain being the product of the elastic properties and the residual strain induced by the volume change during the silicidation reaction.

Another mechanical criterion may be the weak relaxation of the layer during or after its formation. The "Influence of Si substrate orientation on strain development in Pd silicide films grown by solid-state reaction" document by Gergaud, M. Megdiche, O. Thomas and B. Chenevier, Appl Phys. Lett. 83 (2003) 1334-1336 shows an example of variable relaxation and variable final strain as a function of the silicide microstructure.

The formation of a silicide by reaction between the metallic material 170 and silicon will result in a different consumption of silicon depending on which metallic material 170 is deposited. The thickness of the metallic material 170 may thus be chosen as a function of this consumption.

As mentioned above, the relaxation of the silicide formed can be adjusted by adjusting the annealing time.

Figure 5:
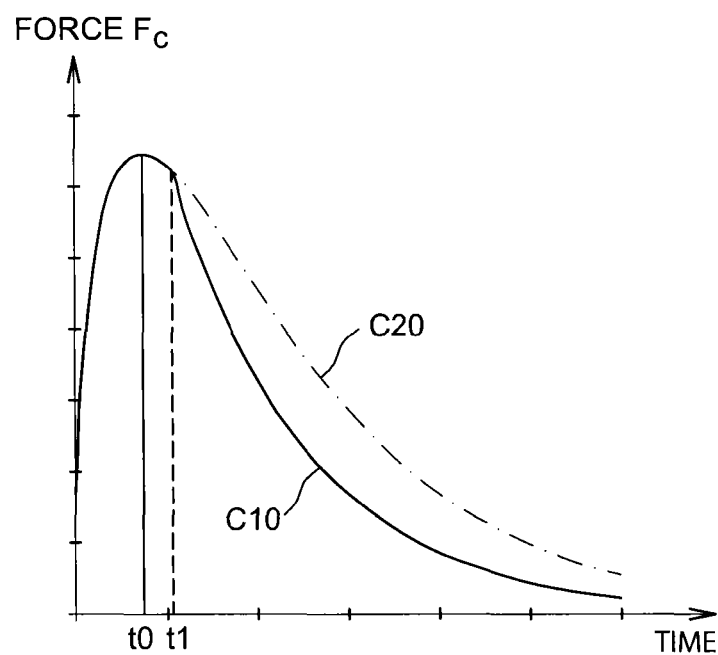
FIG. 5 shows the variation of a force in a silicide zone during its formation as a function of the annealing time.

FIG. 5 shows an example curve C10, representative of a variation of a force in a silicide zone during its formation as a function of the annealing time.

Said force corresponds to the sum of the force induced by the volume change from silicon to silicide, in other words the silicide formation strain, and the relaxation of this force, in other words of the initial strain.

Starting from the annealing start time t=0, the force increases with the volume of silicide formed. This force reaches a maximum at annealing time t=t0 when the absolute value of the increase in force due to each new volume element of silicide is less than the reduction in force due to relaxation of the entire silicide volume already formed since the start time t=0.

FIG. 5 shows a portion of curve C20 in discontinuous lines illustrating the theoretical case of an infinite metal volume.

In the case of a finite metal volume, when all metal has been consumed at time t=t1, only relaxation remains active. In other words, the choice of the force applied to the channel may be fixed using the annealing time.

Times t0 and t1 are very close if a very thin metallic layer is made, particularly less than 20 nm. Thus, the end of consumption of the metallic material may be planned and it may form a reference time for silicidation annealing starting from when the strain level may be modified.

Figure 6:
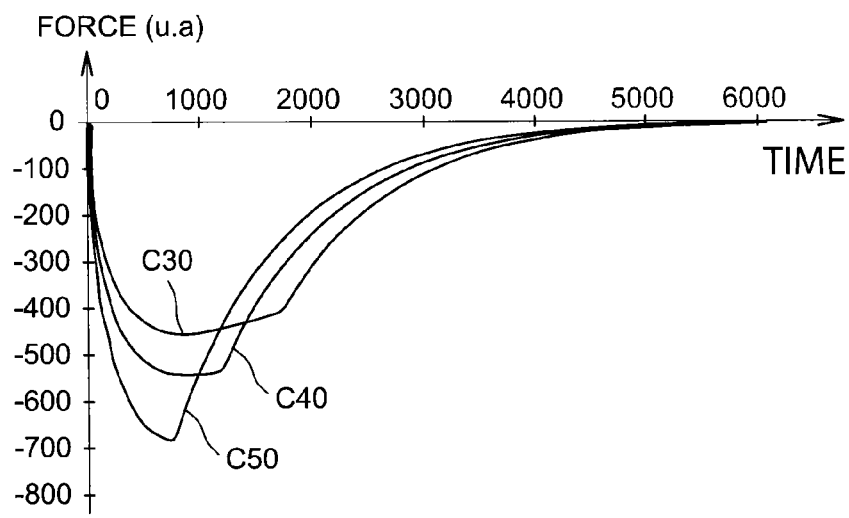
FIG. 6 shows a variation of forces in a silicide zone during its growth for different values of diffusion coefficients.

In FIG. 6, the variation curves C30, C40, C50 are representative of forces in a silicide during its growth for different values of the diffusion coefficients and are equal to Kd, 2*Kd, 3*Kd respectively, where Kd is a diffusion coefficient, at a constant relaxation ratio τ. A definition of these parameters and examples of experimental values are given in document reference P. Gergaud, O. Thomas and B. Chenevier, J. Appl. Phys. 94 (4) (2003) 1584-1591 and in reference S. L. Zhang and F. M. d'Heurle, Thin Solid Films 213, 34~1992.

Figure 7:
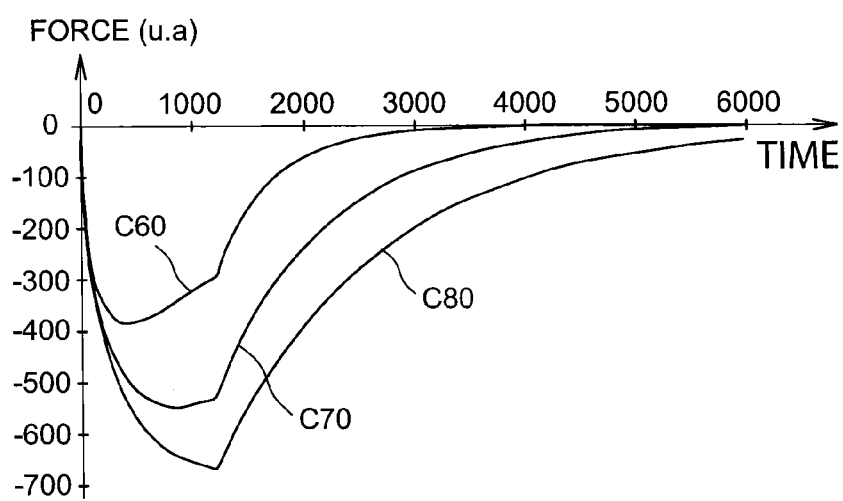
FIG. 7 shows forces in a silicide zone during its growth for different values of the relaxation rate for a constant diffusion coefficient Kd.

In FIG. 7, variation curves C60, C70, C80 are representative of forces in a silicide during its growth for different values of the relaxation ratio equal to τ, 2*τ, 3*τ respectively, for a constant diffusion coefficient Kd.

Metal that has not reacted can be selectively removed once the silicided zones 175, 176, 185, 186 have been made.

Figure 2H:
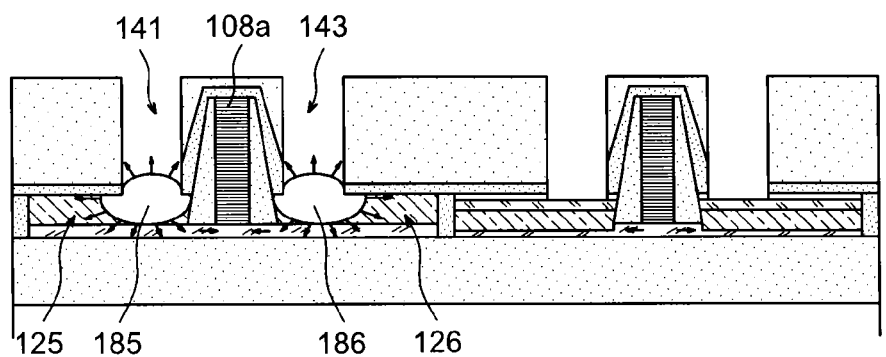

The case of selective removal is shown in FIG. 2H. Excess metal is selectively removed by immersion in a heated chemical solution for which the composition, concentrations and temperature are chosen as a function of the previously deposited metal.

The immersion time is adjusted so that the solution can access the metal at the bottom of the openings 141, 143, 145, 147. For example, when the deposited metal is Ni, the solution used may for example be Caro ($H_2SO_4/H_2O_2$).

A barrier diffusion layer 190 may then be deposited in the openings 141, 143, 145, 147. This diffusion barrier layer 190 may for example be based on TiN or TaN and its thickness may for example be between 1 nm and 10 nm.

Figure 2I:
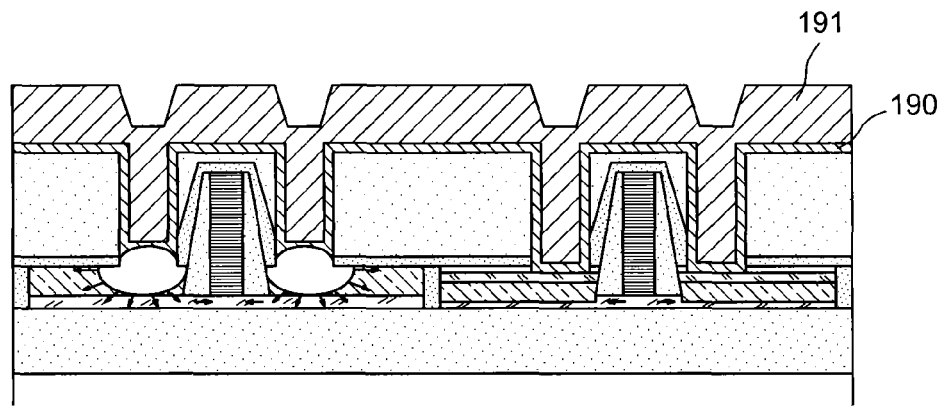
Figure 2J:
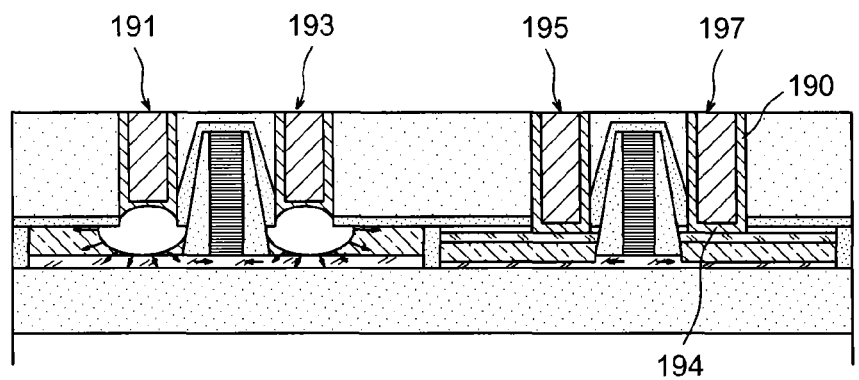

A metallic material 194 is then deposited so as to fill in the openings 141, 143, 145, 147. For example, this metallic material 194 can be Tungsten or Copper (FIG. 2I).

The excess metallic material 194 and the diffusion barrier layer 190 are then removed during chemical-mechanical polishing steps stopping on the layer of dielectric material 133. This is a means of forming contact pads 191, 193, 195, 197 (FIG. 2J) that can be designed to connect the transistors $T_1$, $T_2$ with one or several interconnection levels.

Figure 2K:
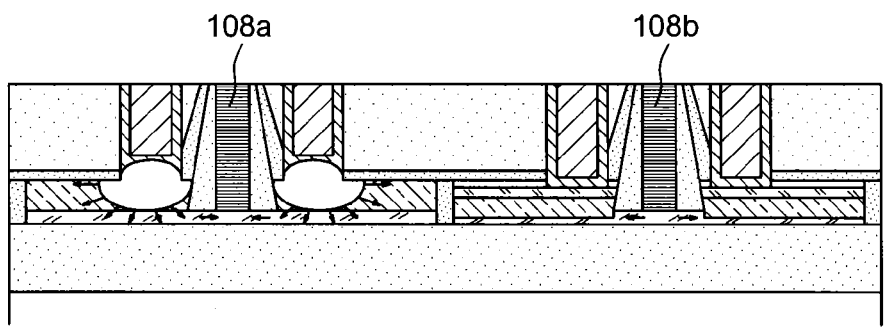

According to one possible embodiment, the method may also comprise a step consisting of exposing the top of the gate 108a of the first transistor T1 and the top of the gate 108b of the second transistor T2 (FIG. 2K).

Access is thus made to gates 108a, 108b. It is then possible to form one or several interconnection levels above the transistors $T_1$ and $T_2$.

Figure 3A:
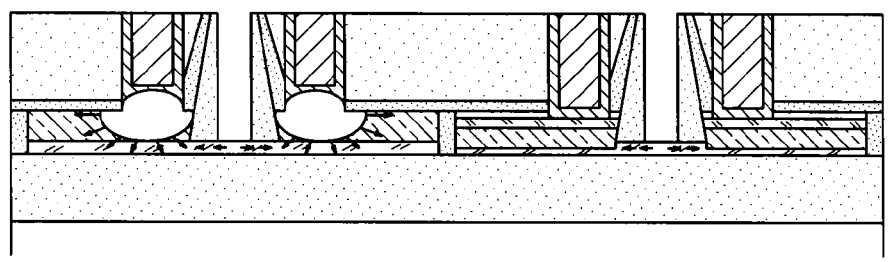
FIGS. 3A-3B show a variant of the method in which sacrificial gates are formed and these sacrificial gates are then replaced by a stack of gate materials.
Figure 3B:
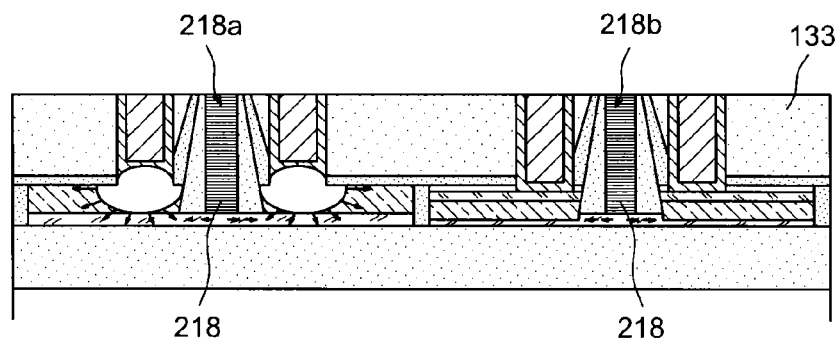

According to one variant shown in FIGS. 3A and 3B, once the previously described steps have been performed, the gates 108a and 108b that in this case acted as sacrificial gates or dummy gates, can be removed (FIG. 3A). These sacrificial or dummy gates can then be replaced by other gates 218a and 218b formed from another gate material.

For this variant, the sacrificial gates 108a, 108b may be formed from a semiconducting material, for example such as polysilicon.

The gates 108a, 108b may be replaced by depositing another gate material 218 such as a metal or a stack of several metals. This can be done by depositing and then removing any excess by chemical-mechanical polishing, stopping on the layer of dielectric material 133.

This variant embodiment is done after the formation of silicided zones and it may lead to a redistribution of strains preferably at channel zones of transistors $T_1$ and $T_2$.

Figure 4A:
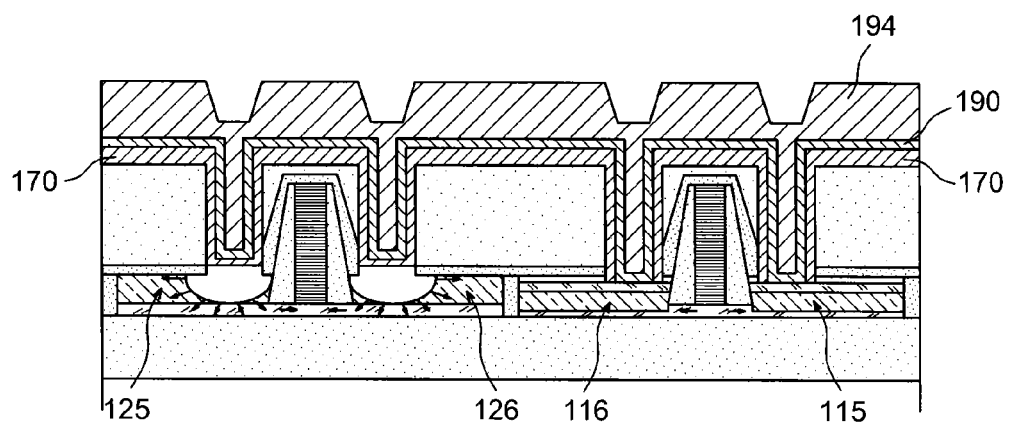
FIGS. 4A-4B show a variant method in which metal deposited after silicidation is kept.
Figure 4B:
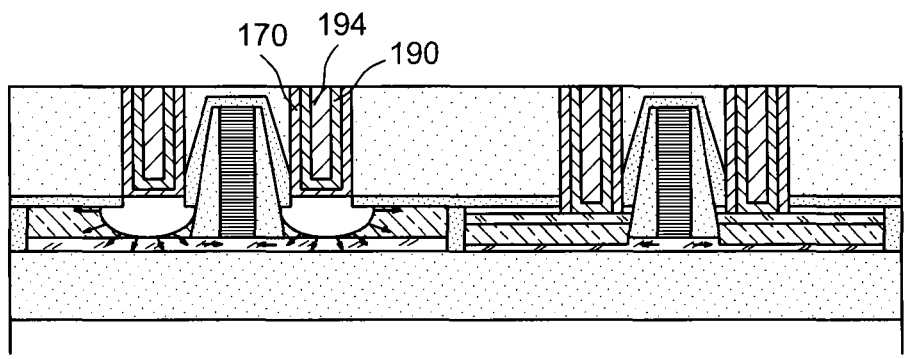

Another variant embodiment is shown in FIGS. 4A-4B.

For this variant, the metal 170 deposited in the openings 141, 143, 145, 147 to silicide the semiconducting zones 115, 116, 125, 126, is kept.

A diffusion barrier layer 190, for example based on TaN or TiN with a thickness for example between 1 nm and 10 nm, is then deposited. A metallic material 194, for example such as tungsten or copper, is then deposited so as to fill in the openings 141, 143, 145, 147 (FIG. 4A).

The metal layer 170 and the barrier layer 190 and the metallic material layer 194 are then removed from the surface of the dielectric material layer, for example by chemical-mechanical polishing stopping on the dielectric (FIG. 4B).

The invention claimed is:

1. A method for making a microelectronic transistor device comprising the following steps:
   a) forming a barrier layer based on a given material on first semiconducting zones located on each side of a first gate block of a first transistor, said given material being different from the material used in said first semiconducting zones,
   b) forming openings passing through the barrier layer, one or several given openings exposing the first semiconducting zones,
   c) depositing a metallic material through said openings, followed by annealing, so as to form first metal and semiconductor alloy zones, the volume of metallic material deposited on the first semiconducting zones, and the annealing duration being chosen so as to form said first metal and semiconductor alloy zones applying a compressive strain on a channel zone of said first transistor,
   wherein in step a), said barrier layer is also formed on second semiconducting zones located on each side of a second gate block of a second transistor, a sacrificial layer being provided between said given material layer and said second semiconducting zones of the transistor of the second type, and wherein in step b), among openings passing through the given material layer, one or several given openings expose the second semiconducting zones,
   the method also comprising between step b) and step c), the removal of the barrier layer by etching through said openings, in step c), said metallic deposition and said annealing being done so as to form second metal and semiconductor alloy zones partially filling in said cavities, a space being maintained between said second metal and semiconductor alloy zones and said barrier layer.

2. The method according to claim 1, wherein the first gate block and the second gate block are supported on a semiconducting layer, and the first semiconducting zones and/or the second semiconducting zones being formed by growth on said semiconducting layer.

3. The method according to claim 2, wherein prior to said growth: thinning of said semiconducting layer in zones located on each side of said first gate block and/or said second gate block.

4. The method according to claim 2, the first semiconducting zones being formed of a semiconducting material designed to compressively strain said semiconducting layer on which said first gate block is supported.

5. The method according to claim 4, wherein the semiconducting material comprises SiGe.

6. The method according to claim 2, wherein the second semiconducting zones being formed from a semiconducting material designed to apply a tensile strain on said semiconducting layer on which said second gate block is supported.

7. The method according to claim 6, wherein the semiconducting material comprises SiC.

8. The method according to claim 1, wherein said barrier layer formed in step a) on the first gate block is designed to apply strain on the first transistor type.

9. The method according to claim 1, wherein said barrier layer is based on a dielectric material.

10. The method according to claim 9, wherein the dielectric material comprises silicon nitride.

11. The method according to claim 1, further comprising the following steps between step a) and step b):
- deposition of at least one insulating layer on the barrier layer,
- formation of holes passing through said insulating layer and exposing said barrier layer by selective etching of said insulating layer relative to said barrier layer.

12. The method according to claim 1, wherein the first gate block and/or said second gate block are based on at least one sacrificial material, the method also comprising the following steps, after step c):
- removal of the barrier layer on said first gate block and/or said second gate block so as to expose said sacrificial material,
- removal of said sacrificial material,
- replacing said sacrificial material by at least one other gate material.

* * * * *